United States Patent [19]
Ota

[11] Patent Number: 5,153,678
[45] Date of Patent: Oct. 6, 1992

[54] METHOD OF DETERMINING REGULARITY OF A PATTERN ARRAY TO ENABLE POSITIONING OF PATTERNS THEREOF RELATIVE TO A REFERENCE POSITION

[75] Inventor: Kazuya Ota, Tokyo, Japan

[73] Assignee: Nikon Corporation, Tokyo, Japan

[21] Appl. No.: 575,426

[22] Filed: Aug. 30, 1990

[30] Foreign Application Priority Data

Sep. 4, 1989 [JP] Japan ................................ 1-228952

[51] Int. Cl.⁵ ............................................. G01B 11/00
[52] U.S. Cl. ...................... 356/401; 250/548; 250/557; 356/400
[58] Field of Search ....................... 356/401, 400, 399; 250/548, 557; 364/491

[56] References Cited

U.S. PATENT DOCUMENTS

| 4,677,301 | 6/1987 | Tanimoto et al. | 250/548 |
| 4,710,026 | 12/1987 | Magome et al. | 356/349 |
| 4,780,617 | 10/1988 | Umatate et al. | 250/548 |
| 4,918,320 | 4/1990 | Hamasaki et al. | 250/548 |

FOREIGN PATENT DOCUMENTS 63-283129 11/1988 Japan.

*Primary Examiner*—Samuel A. Turner
*Assistant Examiner*—Richard E. Kurtz, II
*Attorney, Agent, or Firm*—Shapiro and Shapiro

[57] ABSTRACT

A method of determining regularity of a pattern array on a substrate to enable sequential positioning of patterns of the array relative to a reference position includes the step of calculating a reliability degree regarding a measured value of a pattern position, and the step of determining the regularity of the pattern array on the basis of the calculated reliability degree, and a design value and the measured value of the pattern position.

2 Claims, 9 Drawing Sheets

METHOD OF DETERMINING REGULARITY OF A PATTERN ARRAY TO ENABLE POSITIONING OF PATTERNS THEREOF RELATIVE TO A REFERENCE POSITION

BACKGROUND OF THE INVENTION

1. Field of the Invention

The present invention relates to a positioning (aligning) method between a reticle and a wafer in an exposure apparatus for manufacturing semiconductor devices and liquid crystal display elements.

2. Related Background Art

In recent years, a step-and-repeat reduction projection type exposure apparatus (stepper) has become very popular as an apparatus for transferring a reticle pattern to a wafer with a high resolution in a lithographic process in the manufacture of semiconductor elements. In such a stepper, wavelengths of exposure beams have been shortened, and projection lenses having high numerical apertures (N.A.) have been developed along with the development of semiconductor elements having higher integration. Most recently, a resolution line width on a wafer has reached a submicron (about 0.5 to 0.7 $\mu$m) order. In order to transfer such a high-resolution pattern, alignment (superposing) precision corresponding to its resolution is required. In view of this, it has been proposed to improve alignment precision by increasing, e.g., a resolution of an alignment sensor.

A high-resolution alignment sensor is disclosed in, e.g., U.S. Pat. No. 4,710,026. A one-dimensional diffraction grating mark formed on a wafer is irradiated with coherent parallel beams from two directions to form a one-dimensional interference fringe pattern on the diffraction grating mark. An intensity of a diffracted beam (interference beam) generated by the diffraction grating mark upon radiation of the interference fringe pattern is photoelectrically detected.

According to this method disclosed in the above U.S. Patent, a heterodyne technique for providing a predetermined frequency difference to two parallel beams incident from two directions, and a homodyne technique without providing a frequency difference are available. For example, according to the heterodyne technique, an interference beam from the diffraction grating mark is intensity-modulated with a beat frequency, thereby photoelectrically detecting the intensity of the interference beam.

A heterodyne alignment sensor (to be referred to as a laser interferometric alignment system (LIA system) hereinafter) obtains a phase difference (within $\pm 180°$) between a photoelectric signal (optical beat signal) of an interference beam from a diffraction grating mark on a wafer and an optical beat signal of a reference interference beam separately prepared by two other beams. The LIA then detects a positional error within $\pm P/4$ (where P is the grating pitch).

If the grating pitch is 2 $\mu$m (1-$\mu$m line and 1-$\mu$m space) and a resolution of a phase difference meter is about 0.5°, a resolution of positional error measurement is given as $(P/4) \cdot (0.5/180) = 0.0014$ $\mu$m. As described above, the LIA system has an extremely high resolution as an alignment sensor. It is thus expected the alignment precision can be improved by 10 times or more as compared with a conventional alignment system.

Extended wafer global alignment (to be referred to as enhanced global alignment (EGA) hereinafter) is most popular as an existing stepper alignment scheme, as disclosed in U.S. Pat. No. 4,780,617.

According to the EGA scheme, in order to expose one wafer, after the position of an alignment mark formed on a pattern (chip) formed on a wafer is measured (sample alignment), six parameters, i.e., offset values (X and Y directions) of the central position of the wafer, elongation/contraction values (X and Y directions) of the wafer, a remaining rotation amount of the wafer, and the orthogonality degree between wafer stages (or the orthogonality degree between chips of a chip array), are determined according to a statistical scheme in accordance with a difference between the designed and measured values of the mark position. The position of a second (2nd) chip to be superposed and exposed is corrected in accordance with design values, thereby sequentially stepping the wafer stages.

This EGA scheme has the following advantage. After a smaller number of mark positions (about 3 to 16 positions) than the total number of chips on the wafer is measured prior to wafer exposure, other marks need not be detected or measured, so that a throughput can be increased. In addition, when a sufficient number of marks are sampled and aligned, individual mark detection errors can be averaged on the basis of statistical calculations. Therefore, alignment precision equal to or higher than alignment in units of chips (die-by-die or site-by-site scheme) can be expected for all the chips on the entire wafer surface.

The EGA scheme using the LIA system is most promising as a future stepper alignment scheme from the viewpoints of alignment precision, the throughput, and the like.

In the conventional technique described above, however, when two parallel beams are radiated on a wafer, part of a return beam (0th-order beam) from the wafer is undesirably detected by a photoelectric detector although a diffraction grating mark is not present. Therefore, an optical beat signal is output from the photoelectric detector. In particular, on a wafer having a metal layer made of aluminum, an optical beat signal is generated by a speckle or the like due to grains of the metal layer.

When the two parallel beams are radiated on the diffraction grating mark to measure a wafer position, an optical beat signal as a noise component by a speckle or the like is contained in an optical beat signal output from the photoelectric detector. When alignment is to be performed by the EGA scheme using the LIA system, chips that lead to reduced detection precision of alignment marks due to the above noise component, i.e., chips that lead to poor reliability (accuracy) of measured values of the alignment marks, are equally processed with others. Therefore, alignment (EGA measurement) precision may be degraded by values of poor reliability.

In this case, in order to compensate for the measured values of poor reliability, the number of chips subjected to sampling and alignment is increased or the measured values of poor reliability are eliminated from sampling and alignment to perform positioning without degrading alignment precision.

In the former case, upon an increase in the number of chips to be measured, a time required for measuring the mark positions and performing alignment is undesirably prolonged. In the latter case, the measured values excluded from EGA measurement are not used at all, so that the number of chips used for EGA measurement is decreased thus, each method has significant disadvantages.

SUMMARY OF THE INVENTION

It is an object of the present invention to provide a positioning method which can perform high-precision, high-speed alignment and prevent degradation of throughput and alignment precision.

In order to solve the conventional problems described above, according to the present invention, when regularity of a chip array on a wafer W on which a plurality of chips C are arranged in a matrix form is to be determined to sequentially position the plurality of chips C relative to a predetermined reference position (a projection position of a reticle pattern in a stepper), a degree of reliability (Hxn,Hyn) associated with array coordinate values (Fxn,Fyn) measured by an LIA system is calculated prior to determination of regularity (transform parameters A and O) of the chip array on the basis of design chip array coordinate values (Dxn,Dyn) and actual measurement chip array coordinate values (Fxn,Fyn). The calculated degree of reliability (Hxn,Hyn) is used to determine the transform parameters (A,O).

According to the present invention, the degree of reliability of position data (actual array coordinate values) of the chip subjected to EGA measurement is calculated on the basis of optical information generated by the alignment mark during chip position measurement, i.e., in accordance with the magnitude of a photoelectric signal corresponding to the intensity of the optical information. The calculated degree of reliability is used to determine the regularity (transform parameters A and O).

An influence of position information having poor reliability on the calculation of the transform parameters (A,O) is small as compared with that of position information having high reliability on the calculation. In other words, the reliability of the position information can be accurately reflected in the determination of the transform parameters (A,O).

As a result, degradation of alignment precision by position information having poor reliability and elimination of these pieces of position information can be avoided. High precision can be obtained without decreasing the throughput. In other words, most accurate regularity of the chip array (transform parameters A and O) can be determined.

The reason why the degree of reliability of chip position information is accurately calculated on the basis of optical information generated by an alignment mark, i.e., the principle of the present invention, will be described with reference to FIGS. 1A to 1E. For purposes of the following discussion it is assured that a metal (Al) layer is formed on a surface of a wafer, and that an LIA (heterodyne) alignment sensor is used.

FIGS. 1A and 1D show optical beat signals SDa and SDd which do not contain optical beat signals (noise components) generated by speckles due to grains. The magnitude of the signal SDd is smaller than that of the signal SDa due to thin-film interference of a resist layer, or an irregular pattern of an alignment mark. FIG. 1B shows an optical beat signal (noise component) SDb generated by a speckle. FIGS. 1C and 1E show optical beat signals SDc and SDe finally output from a photoelectric detector. The level of the optical beat signal is plotted along the ordinate of each of FIGS. 1A to 1E, and time is plotted along the abscissa thereof. Relations representing the waveforms of the optical beat signals SDa to SDe are also added to FIGS. 1A to 1E, respectively. In these relations, f represents a beat frequency (Hz), and t represents time (s). The LIA system detects a positional error upon calculation of a phase difference between each of the optical beat signals SDa to SDe and a reference optical beat signal. In FIGS. 1A to 1E, the reference optical beat signal is not illustrated. For the sake of descriptive simplicity, assume that the phase of the reference optical beat signal is equal to that of the optical beat signal SDa, i.e., their phase difference is zero.

Phase components $\psi_0$ of the optical beat signals SDa and SDd shown in FIGS. 1A and 1D represent accurate mark positions, respectively. If a mark position (coordinate value) is given as X and a grating pitch is given as P, the following relationship can be obtained, as indicated by equation (1). Note that since the optical beat signal SDb shown in FIG. 1B is a noise component, its phase component $\psi_N$ is not associated with the mark position and does not satisfy equation (1).

$$X = (P/2) \cdot (\psi_0/2\pi) \quad (1)$$

Phase components $\psi_S$ and $\psi_{S'}$ in FIGS. 1C and 1E contain the noise components SDb and do not coincide with the phase components $\psi_0$ in FIGS. 1A and 1D. Phase errors $\Delta\psi$ ($\Delta\psi = \psi_0 - \psi_S$) and $\Delta\psi'$ ($\Delta\psi' = \psi_0 - \psi_{S'}$) occur between the optical beat signals SDa and SDd and the optical beat signals SDc and SDe.

When a ratio g/G (or g/G') of an amplitude (to be referred to as a noise amplitude hereinafter) g of the optical beat signal SDb which is the noise component to an amplitude (to be referred to as a mark amplitude thereinafter) G (or G') of the optical beat signal SDa (or SDd) is increased, the error $\Delta\psi$ ($\Delta\psi'$) is increased accordingly. This is apparent since the errors $\Delta\psi$ and $\Delta\psi'$ satisfy condition $\Delta\psi < \Delta\psi'$ upon comparison between the ratio (g/G) and the ratio (g/G'), i.e., (g/G < g/G').

The mark amplitude G and the noise amplitude g vary even on the same wafer in units of chips (alignment marks) by a small change in resist film thickness and mark shape. A strict relationship (predetermined amplitude relationship) is not established between the mark amplitude G and the noise amplitude g. For example, of all chips, a chip having a maximum mark amplitude G may have a minimum noise amplitude g. On the other hand, a chip having a minimum mark amplitude G may have a maximum noise amplitude g.

For almost all the wafers, a maximum noise amplitude gmax and a minimum mark amplitude Gmin have the relation gmax < Gmin. When mark amplitudes G, i.e., amplitudes $\overline{G}$ and $\overline{G}$, of the optical beat signals SDc and SDe actually output from the photoelectric detector, are increased, the amplitude ratio (g/G) is decreased accordingly. On the contrary, when the amplitudes $\overline{G}$ and $\overline{G}'$ are decreased, the amplitude ratio (g/G) is increased accordingly.

As is apparent from the above description, when the amplitudes $\overline{G}$ and $\overline{G}'$ are increased, the amplitude ratio (g/G), i.e., the error $\Delta\psi$ (or $\Delta\psi'$) is decreased. Therefore, when the position of the alignment mark is detected by the LIA system and at the same time, the amplitude (Gxn,Gyn) of the optical beat signal of the interference beam is obtained, the magnitude of the error ($\Delta\psi$) during position measurement, i.e., the reliability degree (Hxn,Hyn) of the position information can be determined.

Various functions may be proposed to cause the amplitudes to correspond to the reliability degree. For example, when a constant $G_0$ as a threshold value is empirically (experimentally) determined in advance, the reliability degree $Hn$ can be obtained from the amplitude $Gn$ by equation (2):

$$Hn = MAX\,[(Gn - G_0)/(Gmax - G_0), 0] \qquad (2)$$

for $n = 1, 2, \ldots, m$ (where m is the number of chips subjected to sampling and alignment)

where Gmax is the maximum amplitude of the amplitudes Gn to be measured.

As is apparent from equation (2), the reliability degree of the alignment mark having the maximum amplitude Gmax becomes 1, and reliability degrees of marks having a value smaller than the constant G0 are given as 0. Reliability degrees of marks having intermediate amplitudes fall within the range of $0 < Hn < 1$. It is thus apparent that the reliability degree comes close to 1 when the signal intensity is increased.

According to the present invention, during EGA alignment, the reliability degrees of the position data of the alignment marks are obtained by using the above principle, and degradation of the throughput and alignment precision (EGA measurement) caused by the measured values having poor reliability can be prevented.

DESCRIPTION OF THE PREFERRED EMBODIMENTS

Figure 1A:
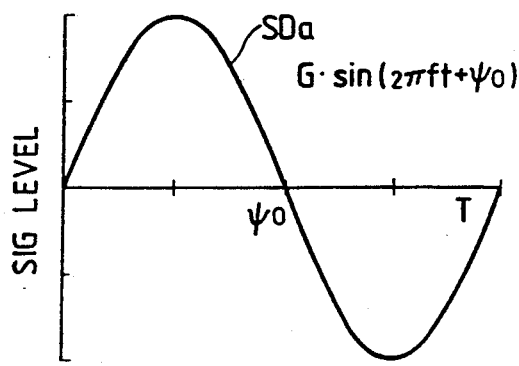
FIGS. 1A to 1E are waveform charts of optical beat signals for explaining the principle of the present invention.
Figure 1D:
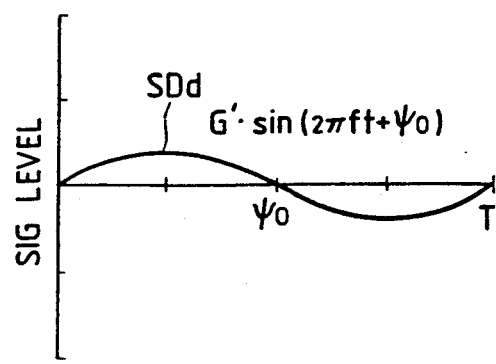
Figure 1B:
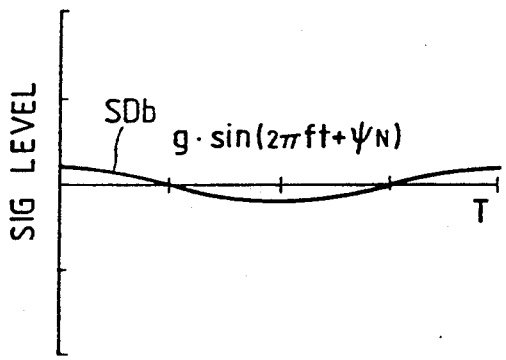
Figure 1C:
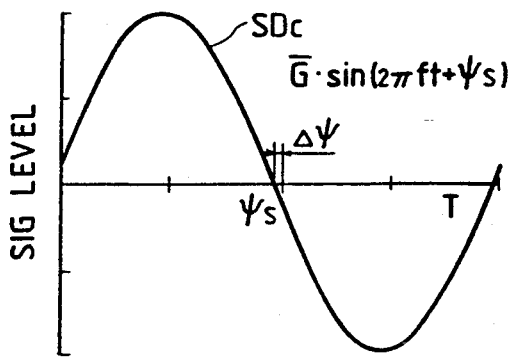
Figure 1E:
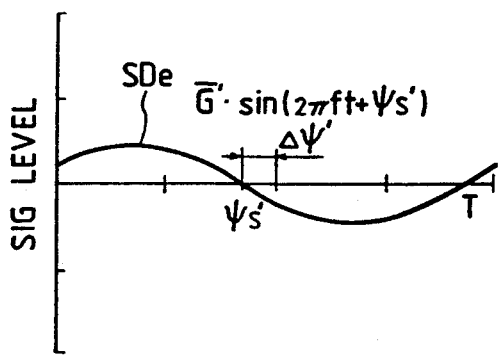
Figure 2:
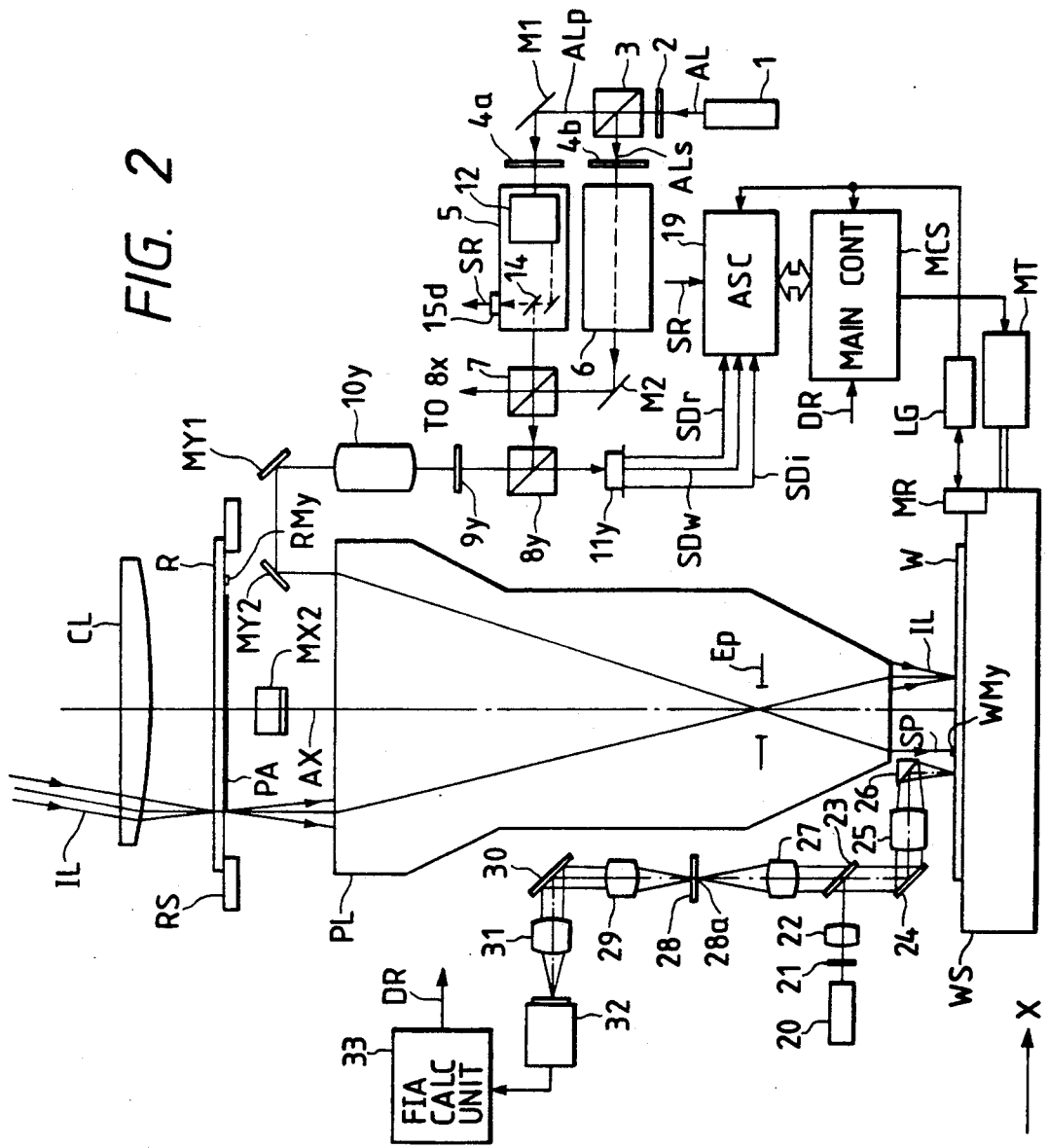
FIG. 2 is a schematic diagram of a stepper which suitably employs the method of the present invention.

FIG. 2 is a schematic diagram of a stepper suitably employing a method of the present invention. An exposure illumination unit (not shown) generates g-rays, i-rays, or an illumination beam IL (e.g., KrF excimer laser beam) having a wavelength (exposure wavelength) capable of photosensing a resist layer. The illumination beam IL illuminates a pattern area PA of a reticle R through a main condenser lens CL at a uniform illuminance. The reticle R is placed on a reticle stage RS so that an optical axis AX of a projection lens PL passes through a projection center (the center of the pattern area) of the reticle R. The illumination beam IL passing through the pattern area PA is incident on the projection lens PL whose both sides (or one side) are telecentric. The projection lens PL projects an image of the circuit pattern formed in the pattern area PA onto a wafer W having an upper surface with a resist layer. The wafer W is placed on a wafer stage WS through a wafer holder ($\theta$ table) (not shown). The wafer stage WS can be two-dimensionally moved by a driver MT in the X and Y directions in accordance with a step-and-repeat scheme. The positions of the wafer stage WS in the X and Y directions are always detected by a laser interferometer LG with a resolution of, e.g., about 0.02 $\mu$m. A mirror MR is fixed at an end of the wafer stage WS to reflect a laser beam from the laser interferometer LG.

A TTL alignment system (to be referred to as Site by Site Alignment or SSA system) as a combination of the LIA system and a laser step alignment (LSA) system capable of performing high-speed alignment and measurement is arranged in the stepper. The SSA system requires a minimum space around the reticle since the optical members except for the LIA and LSA system beam forming optical systems (5 and 6) are commonly used.

Figure 3:
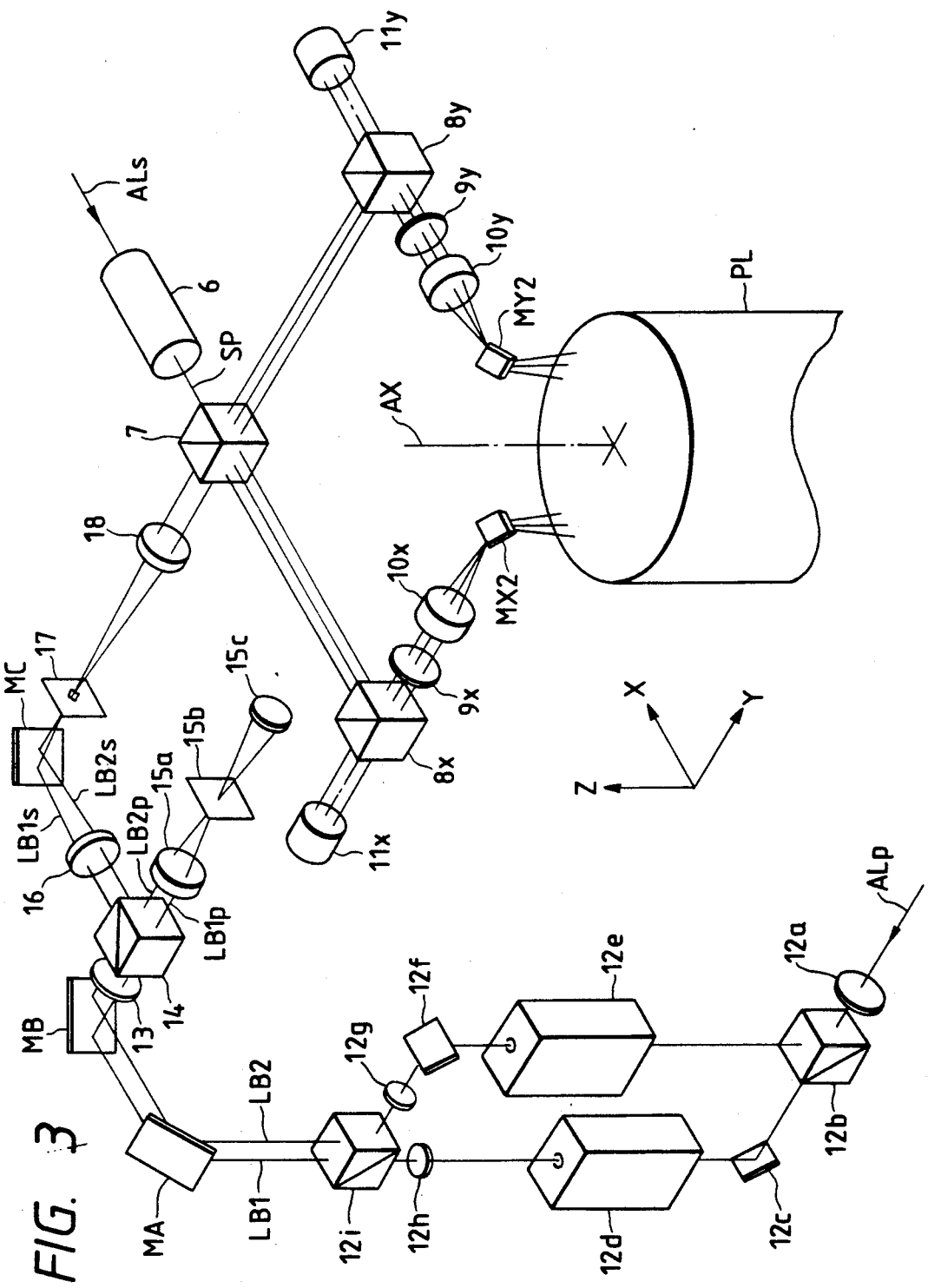
FIG. 3 is a perspective view showing a detailed arrangement of an SSA system (particularly an LIA system) suitably employing the method of the present invention.

A schematic arrangement of the SSA system will be described in detail with reference to FIGS. 2 and 3. FIG. 3 is a perspective view showing a detailed arrangement of the SSA system and, particularly, the LIA optical system. This system is disclosed in U.S. Pat. No. 4,677,301, and a detailed description thereof will be omitted.

Figure 4:
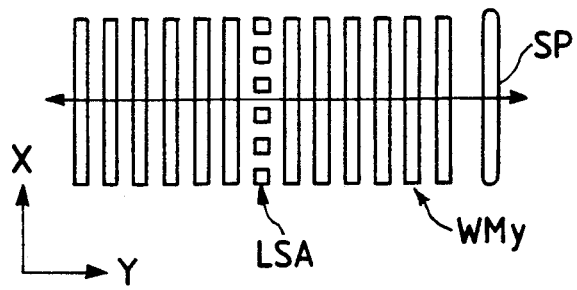
FIG. 4 is a plan view showing a schematic pattern of wafer marks.

Wafer marks WMx and WMy (only the mark WMy is illustrated) are formed on the wafer W together with chips C. As shown in FIG. 4, the wafer mark WMy comprises a diffraction grating mark (to be referred to as LSA mark hereinafter) consisting of a plurality of dot marks aligned in the X direction and a bar pattern consisting of a plurality of bars (12 bars) extending in the X direction. The wafer mark WMy is aligned and centered on the LSA mark in the Y direction so that a line-and-space pattern having a pitch of, e.g., 4 $\mu$m is formed.

Referring to FIG. 2, a laser source 1 generates orthogonally linearly polarized alignment illumination light (beam) AL having a predetermined wavelength. The beam AL reaches a polarizing beam splitter 3 through a ½ wavelength plate 2 and is split into a beam ALp consisting of a P-polarized component and a beam ALs consisting of an S-polarized component. The laser source 1 preferably comprises an He-Ne laser having a wavelength of 633 nm, i.e., a wavelength almost insensitive to the resist layer. The beam ALp passing through the polarizing beam splitter 3 is incident on a first beam forming optical system (to be referred to as an LIA optical system hereinafter) 5, including a 2-beam frequency shifter 12, through the mirror M1 and a shutter 4a. Meanwhile, the beam ALs reflected by the polarizing beam splitter 3 is incident on a second beam forming optical system (to be referred to as an LSA optical system hereinafter) 6, including a cylindrical lens, through a shutter 4b. The shutters 4a and 4b comprise 4-blade rotary shutters for opening or closing the optical paths of the beams ALp and ALs, and are controlled and rotated so that only one optical path is always open.

In the 2-beam frequency shifter 12 shown in FIG. 3, the beam ALp is split into a P-polarized beam and an S-polarized beam by a ½ wavelength plate 12a and a polarizing beam splitter 12b so as to have equal light amounts. The P-polarized beam passing through the polarizing beam splitter 12b is incident on a first acoustic/optical modulator 12d (to be referred to as an AOM 12d hereinafter) through a mirror 12c. The S-polarized beam reflected by the polarizing beam splitter 12b is incident on a second acoustic/optical modulator 12e (to be referred to as an AOM 12e hereinafter).

The AOM 12d is driven by a high-frequency signal SF1 having a frequency f1. Although not shown in FIG. 3, the AOM 12d outputs a beam LB1 of the first order deflected by a deflection angle determined by its frequency f1. On the other hand, the AOM 12e is driven by a high-frequency signal SF2 having a frequency f2 (f2=f1−Δf) (where Δf is the frequency difference between the frequency f1 of the beam LB1 and the frequency f2). The AOM 12e outputs a beam LB2 of the first order deflected by an angle determined by the frequency f2.

Of all the beams incident on the AOMs 12d and 12e, the beam of the 0th order is shielded by a slit unit (not shown) located at an appropriate position. In this embodiment, the drive frequencies f1 and f2 of the AOMs 12d and 12e are given as, e.g., 80.025 MHz and 80.000 MHz, and their difference Δf is as low as 25 kHz. Therefore, the deflection angles of the beam of the first order at the AOMs 12d and 12e are equal to each other.

The beam LB1 modulated to have the frequency f1 by the AOM 12d is incident on a polarizing beam splitter 12i located on the pupil plane or a position near it in the SSA system through a lens system 12h. Meanwhile, the beam LB2 modulated to have the frequency f2 by the AOM 12e is incident on the polarizing beam splitter 12i through a mirror 12f and a lens system 12g. The polarizing beam splitter 12i does not coaxially synthesize the beams LB1 and LB2, but synthesizes them in parallel so that the beams LB1 and LB2 are spaced apart from each other by a predetermined distance.

The parallel beams LB1 (i.e., a P-polarized beam having the frequency f1) and LB2 (i.e., an S-polarized beam having the frequency f2) output from the polarizing beam splitter 12i (i.e., a 2-beam frequency shifter 12) are respectively reflected by mirrors MA and MB, and the reflected beams are incident on a polarizing beam splitter 14 through a ½ wavelength plate 13. The beam LB1 is split into an P-polarized beam LB1p and an S-polarized beam LB1s, both of which have the frequency f1. The beam LB2 is split into a P-polarized beam LB2p and an S-polarized beam LB2s, both of which have the frequency f2.

The two P-polarized beams LB1P (frequency: f1) and LB2p (frequency: f2) passing through the polarizing beam splitter 14 are incident and focused (crossed) on a reference diffraction grating 15b fixed on the apparatus from different directions at a predetermined crossing angle ω through a lens system (inverse Fourier transform lens) 15a for transforming a pupil to an image plane. A photoelectric detector (light-receiving element) 15c independently receives (photoelectrically converts) an interference beam between the 0th-order beam of the beam LB1p and the +1st-order beam of the beam LB2p, both of which pass through the reference diffraction grating 15b, and an interference beam between the −1st-order beam of the beam LB1p and the 0th-order beam of the beam LB2p. The photoelectric detector 15c adds sinusoidal photoelectric signals corresponding to the intensities of the two interference beams. As a result, a photoelectric signal SR has a frequency proportional to the frequency difference Δf between the beams LB1p and LB2p and serves as an optical beat signal. At this time, the grating pitch of the reference diffraction grating 15b is determined to be equal to a pitch of the interference fringe pattern formed by the beams LB1p and LB2p. Note that the photoelectric detector 15c may receive the two interference beams on the same light-receiving plane and may output a photoelectric sum signal corresponding to the intensity of the composite interference beam on this light-receiving plane. With this arrangement, a distance between the reference diffraction grating 15b and the photoelectric detector 15c can be advantageously decreased.

The two S-polarized beams LB1s (frequency: f1) and LB2s (frequency: f2) reflected by the polarizing beam splitter 14 become parallel beams inclined by a predetermined angle by a lens 16. These parallel beams temporarily cross each other through a mirror MC at a field aperture 17 located at a position conjugate with the wafer W. These beams are then incident on a beam splitter 7 through a lens 18. Components from the 2-beam frequency shifter 12 to the lens 18 constitute the LIA optical system 5. Note that a rhombic or parallelepiped opening having an edge inclined from the interference fringe pattern formed by the beams LB1s and LB2s is formed at the field aperture 17.

The beam ALs passing through the shutter 4b is shaped into an elongated spot beam SP (S-polarized beam) by the LSA optical system 6 (a cylindrical lens and the like). Although not shown in FIG. 3, the beam SP is incident on the beam splitter 7 through the mirror M2 (FIG. 2).

The beam splitter 7 is located so that the beams LB1s and LB2s are incident almost perpendicularly to the spot beam SP. The beam splitter 7 splits the beams LB1s and LB2s and the spot beam SP into halves having equal light amounts (amplitude division). That is, in two (X and Y directions) detection optical systems (including objective lenses 10x and 10y) located behind the beam splitter 7, the optical axis of the LIA optical system 5 is accurately aligned with that of the LSA optical system 6, and the beams LB1s and LB2s and the spot beam SP share the objective lenses 10x and 10y and the like.

The arrangements of the two detection optical systems located behind the beam splitter 7 are identical with each other, and an arrangement of only one system (i.e., the Y-direction detection optical system shown in FIG. 2) will be described. In FIG. 2, only a mirror MX2 corresponding to a mirror MY2 of the Y-direction detection optical system is illustrated, and the mirror MY1 is not illustrated in FIG. 3.

Referring to FIGS. 2 and 3, the beams LB1s and LB2s temporarily cross each other on a spatial focal point (wafer conjugate plane) by the objective lens 10y and are then incident on the projection lens PL through the mirrors MY1 and MY2. The beams LB1s and LB2s (circular polarization) are temporarily focused into a beam spot and pass through an entrance pupil Ep. The beams become parallel beams inclined from the pitch direction (Y direction) the wafer mark WMy (FIG. 5) so as to be symmetrical about the optical axis Ax. These beams are incident (crossed) on the wafer mark WMy from different directions at a crossing angle ω. Note that the crossing angle ω between the beams LB1s and LB2s does not exceed the numerical aperture (N.A.) on the exit side (wafer W) of the projection lens PL.

After the spot beam SP is temporarily focused like a slit by the objective lens 10y, it reaches the entrance pupil Ep of the projection lens PL through the mirrors MY1 and MY2. The beam passes through almost the center of the entrance pupil Ep, and an image is formed on the wafer W within the exposure field so as to extend in the X direction and to be directed toward the optical axis AX.

At the entrance pupil Ep, the spots of the beams LB1s and LB2s pass through the center of the spot beam SP and are focused to be almost point-symmetrical about the center of the spot beam S on a line extending in the longitudinal direction (Y direction) of the spot beam SP. In this case, the longitudinal direction (Y direction) of the spot beam SP at the entrance pupil Ep is almost perpendicular to the longitudinal direction (X direction) of the spot beam SP radiated on the wafer W.

Figure 5:
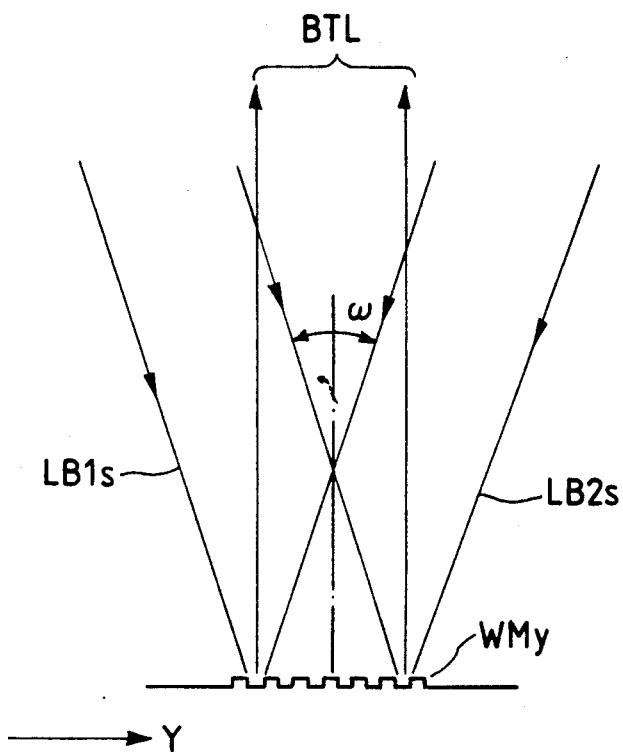
FIG. 5 is a view showing a state of wafer mark detection.

Referring to FIG. 5, when the beams LB1s and LB2s are incident on the wafer mark WMy at the crossing angle ω, a one-dimensional interference fringe pattern is formed on any plane perpendicular to the optical axis AX within the space (in which the beams LB1s and LB2s cross each other) at a pitch P' (P'=P/2 in this embodiment) as a 1/N multiple (N is an integer) of the grating pitch P. This interference fringe pattern is moved (flowed) in the direction of pitch (Y direction) of the wafer mark WMy in correspondence with the frequency difference Δf between the beams LB1s and LB2s. A moving velocity V of the pattern is given as follows:

$$V = \Delta f \cdot P'$$

The ±1st-order diffracted beam (interference beam) BTL traveling along the optical axis AX is generated from the wafer mark WMy. This interference beam BTL has a beat wavefront in which a dark-and-bright pattern is periodically repeated upon movement of the interference fringe pattern. This interference beam BTL passes through the projection lens PL and a ¼ wavelength plate 9y and becomes a P-polarized beam. This P-polarized beam passes through a polarizing beam splitter 8y and is received by a photoelectric detector (light-receiving element) 11y located on a pupil conjugate plane. A photoelectric signal SDw output from the photoelectric detector 11y becomes a sinusoidal AC signal (a beat frequency, to be referred to as an optical beat signal hereinafter) SDw corresponding to the period of the dark-and-bright pattern of the interference fringes. This AC signal is input to an alignment signal processing circuit (to be referred to as an ASC hereinafter) 19.

Meanwhile, the spot beam SP of the LSA system relatively scans the wafer mark WMy (LSA mark) in the Y direction, and diffracted beams (first and higher orders) and scattered beams except for the regularly reflected beam (0th-order beam) are generated from the mark. These pieces of information (circular polarization) pass through the projection lens PL again and are converted into a P-polarized beam by the ¼ wavelength plate 9y. The P-polarized beam passes through the polarizing beam splitter 8y and is received by the photoelectric detector 11y. Of these pieces of information, the photoelectric detector 11y photoelectrically detects diffracted beams of higher orders, e.g., ±1st- to ±3rd-order diffracted beams and scattered beams. Photoelectric signals SDi and SDr respectively corresponding to the intensities of the diffracted beam and the scattered beam are output to the ASC 19.

Figure 6:
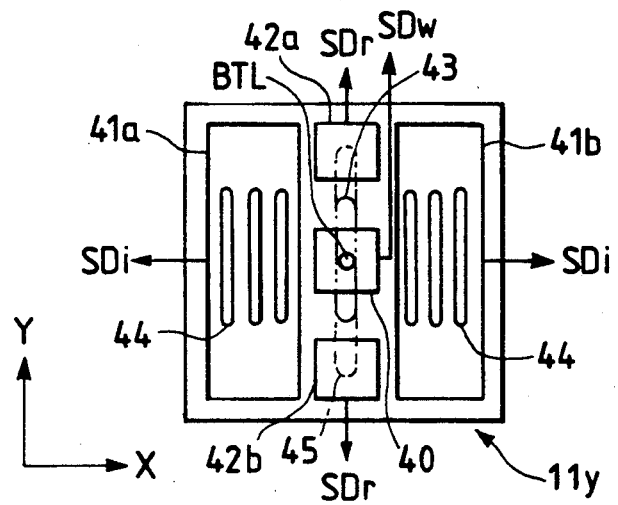
FIG. 6 is a view showing a detailed arrangement of an SSA photoelectric detector.

A schematic arrangement of the photoelectric detector 11y (the detector 11x has an identical arrangement) is shown in FIG. 6. As shown in FIG. 6, the photoelectric detector 11y comprises a split light-receiving element having light-receiving surfaces 41a and 41b corresponding to distributions of, e.g., ±1st- to -±3rd-order diffracted beams 44 generated by the LSA mark upon radiation of the spot beam SP, light-receiving surfaces 42a and 42b corresponding to distributions of scattered beams 45 generated from the edge of the LSA mark, and a light-receiving surface 40 located to receive the interference beam BTL generated by the wafer mark WMy upon radiation of the beams LB1p and LB2p.

As shown in FIG. 4, when the wafer mark WMy (LSA mark) is relatively scanned in the Y direction with the spot beam SP extending like a slit-like beam in the X direction on the wafer W, a regularly reflected beam 43 together with the diffracted beam 44 is generated by the LSA mark. The regularly reflected beam 43 is focused on the light-receiving surface 40. In this embodiment, however, since the shutters 4a and 4b are rotated to prevent the spot beam SP and the beams LB1s and LB2s from being simultaneously incident on the wafer W, crosstalk between the regularly reflected beams 43 and the interference beam BTL on the light-receiving surface 40 can be prevented.

When the LSA system (spot beam SP) is used, the ASC 19 receives the photoelectric signal SDi (or SDr) output from the photoelectric detector 11y and a position signal from the laser interferometer LG. The ASC 19 samples the photoelectric signal SDi (or SDr) in synchronism with an up/down pulse signal generated every unit movement (0.02 μm) of the wafer stage WS. Each sampling value is converted into a digital value, and the digital values are sequentially stored in a memory in an order of addresses. Predetermined processing is performed to detect a Y-direction position of the wafer mark WMy (LSA mark). It is preferred that the ASC 19 simultaneously performs waveform processing of the photoelectric signals SDi and SDr, and a position of the wafer mark WMy is determined on the basis of both detection results.

When the LIA system (beams LB1s and LB2s) is used, the ASC 19 receives the optical beat signal SDw output from the photoelectric detector 11y and the optical beat signal SR output as the reference signal from the photoelectric detector 15c and detects a phase difference between the waveforms of the optical beat signals SR and SDw with reference to the optical beat signal Sr. This phase difference (±180°) corresponds to a relative positional error within P/2 of the wafer mark WMy in a one-to-one correspondence.

If the pitch of the wafer marks WMx and WMy is given as 8 μm and a resolution of phase detection of the ASC 19 is given as 0.2°, the measurement resolution of the positional error is given as 0.0044 μm. In practice, since an influence of noise is also imposed on the positional error, a practical measurement resolution is about 0.01 μm (0.4° in phase). This detection scheme is a so-called heterodyne scheme. When the wafer W has a positional error range of P/2, the positional error can be detected with a high resolution even in a still state.

FIG. 2 also shows an off-axis alignment optical system (Field Image Alignment or FIA system) fixed at a position spaced apart from the projection lens PL by a predetermined distance to enlarge a wafer mark and to allow observation of it. An illumination light source 20 generates an illumination beam having a predetermined wavelength width. This illumination beam passes through a filter 21 which cuts off a resist layer sensitive wavelength range and an infrared wavelength range and reaches a half mirror 23 through a lens system 22. The beam then passes through a mirror 24 and an objective lens 25 and is reflected by a prism (mirror) 26 fixed at a peripheral portion of a lower portion of a lens barrel so as not to shield the field of view of the projection lens PL. The reflected beam vertically illuminates the wafer W.

The illumination beam may be selected to have a wavelength (nonexposure wavelength) extremely insensitive to the resist layer and have a broad spectral distribution to the wavelength range required for mark detection, or may have a plurality of sharp spectral peaks. The objective lens 25 has a telecentric system on at least the object (wafer) side and has an anti-reflection coating (aberration correction) for the wavelength range of the illumination beam.

A beam reflected by the wafer W is focused by a lens system 27 on an index plate (focal point plate) 28 through the objective lens 25 and the half mirror 23. The index plate 28 is located at a position conjugate with the wafer W by the objective lens 25 and the lens system 27. The index plate 28 has an index mark 28a (light-shielding mark made of chromium) consisting of four rectangular marks formed to be parallel to each other and spaced apart from each other by a predetermined distance. Images of the wafer marks WMx and WMy and the index mark 28a are focused on the light-receiving surface of an image pickup device 32 such as an ITV or a CCD camera through relay lens systems 29 and 31 and a mirror 30. A video signal from the image pickup device 32 is input to an FIA operation unit 33 together with the position measurement signal from the laser interferometer LG. The FIA operation unit 33 calculates an error of the mark image from the index mark 28a on the basis of the waveform of the video signal and outputs information (position information DR) associated with a mark center detection position of the FIA system which is obtained when the mark image is located at the center of the index mark 28a.

A main controller MCS simultaneously drives the shutters 4a and 4b, outputs a predetermined drive command to the driver MT on the basis of the mark position information and the phase difference (positional error amount) information from the ASC 19, and the position information from the laser interferometer LG, and performs alignment between the reticle R and the wafer W. In addition, the main controller MCS controls the overall operations of the apparatus including the FIA system (20 to 33).

Figure 7:
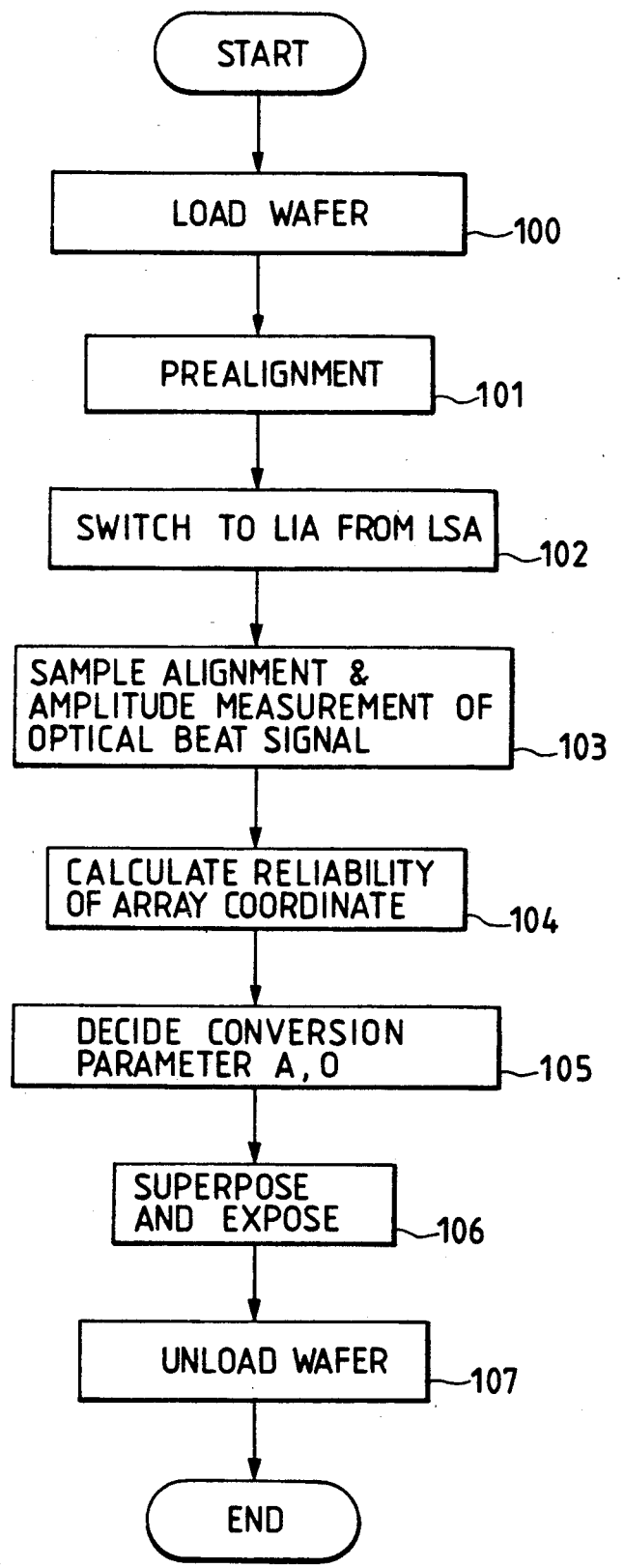
FIG. 7 is a schematic flow chart showing an operation of an embodiment of the present invention.

An aligning operation of this embodiment together with a series of exposure operations in the stepper will be described with reference to FIGS. 7 to 9. FIG. 7 is a schematic flow chart showing an operation of this embodiment. In this embodiment, EGA alignment using an LIA system is performed.

The wafer W loaded on the wafer stage WS is placed with a precision of several tens of $\mu$m by a mechanical prealignment unit (not shown) (step 100).

Prealignment of the wafer W is performed using the FIA system and the SSA system (LSA system). In this case, the shutters 4a and 4b are simultaneously rotated to open the optical path for the beam ALs incident on the LSA optical system 6, while the optical path for the beam ALp incident on the LIA optical system 5 is kept closed.

The FIA system detects Y-direction positions of two chips located symmetrically about the wafer center and located near the peripheral position of the wafer W. On the other hand, the LSA system detects an X-direction position of a chip which is equidistant from the two chips and is located near the peripheral portion of the wafer W. The main controller MCS calculates a positional error amount (including a rotational error) of the wafer W with respect to the X-Y coordinate system on the basis of the position data of the three chips. Upon driving the wafer W on the basis of the calculated positional error amount, prealignment of the wafer W is completed (step 101).

As a result, the relative positional error between the reticle R and the wafer W (chip) can be corrected with a precision of 1 $\mu$m or less. At the same time, the wafer stage WS is stepped in accordance with the design chip array coordinate values (Dxn,Dyn) and the so-called array map. The wafer marks WMx and WMy can be positioned within the range of $\pm P/4$ with respect to the beams LB1s and LB2s emitted from the SSA system.

Upon completion of prealignment of the wafer W, the shutters 4a and 4b are rotated by the same operations as described above. The beams LB1s and LB2s in place of the spot beam SP are radiated on the wafer W. Switching from the LSA system to the LIA system is completed (step 102).

Figure 8:
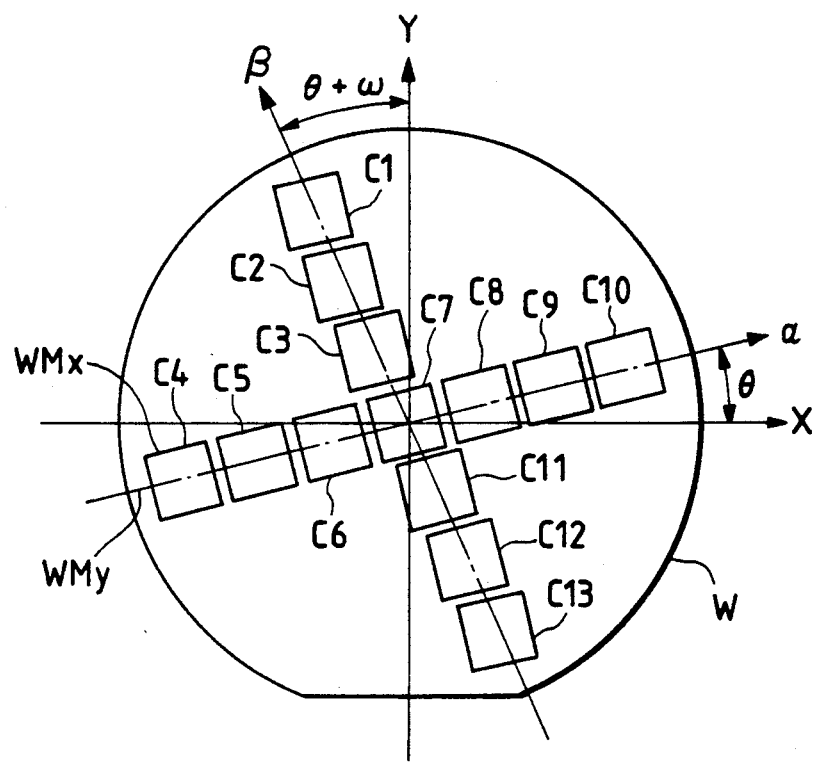
FIG. 8 is a view showing a chip array state on a wafer.

After the operation in step 102 (prealignment) is completed, a rotational amount $\theta$ (a rotational amount which cannot be corrected in prealignment) of the $\alpha$-$\beta$ coordinate system with respect to the coordinate system (the orthogonal X-Y coordinate system) of the wafer stage WS is left uncorrected, as exaggerated in FIG. 8. Note that, of all the chips arranged in a matrix form in the $\alpha$-$\beta$ coordinate system, only chips C1 to C13 arranged on the $\alpha$-axis and the $\beta$-axis which pass almost the center of the wafer W are illustrated in FIG. 8. The positioning wafer marks WMx and WMy (FIG. 4) are formed in correspondence with the chips C1 to C13.

By determining six parameters, i.e., the remaining rotational amount $\theta$ of the $\alpha$-$\beta$ coordinate system, an inclination amount $\omega$ (orthogonal degree) of the $\alpha$-$\beta$ coordinate system, linear elongation/contraction amounts (scaling) Rx and Ry in the X($\alpha$) and Y($\beta$) directions of the wafer W, and translation amounts (offset amounts) Ox and Oy in the X($\alpha$) and Y($\beta$) directions of the wafer W, that is, by determining the transform parameters (A,O), actual chip C array coordinate values (Fxn,Fyn) and the design chip array coordinate values (Dxn,Dyn) are uniquely determined (correspondence) by the following mapping equation (matrix $Fn = A \cdot Dn + O$) (3). The transform parameters (A,O) in the above mapping relation include the remaining rotational amount $\theta$, the orthogonality degree $\omega$ and scaling amounts (Rx,Ry), and offset amounts (Ox,Oy) as parameters. The transform parameter A is a matrix of two rows and two columns, and the transform parameter O is a matrix of two rows and one column.

$$\begin{bmatrix} Fxn \\ Fyn \end{bmatrix} = A \begin{bmatrix} Dxn \\ Dyn \end{bmatrix} + O \tag{3}$$

$$A = \begin{bmatrix} a_{11} & a_{12} \\ a_{21} & a_{22} \end{bmatrix} \quad O = \begin{bmatrix} b_{11} \\ b_{21} \end{bmatrix}$$

The main controller MCS measures (samples and aligns) array coordinate values (Fxn,Fyn) of a plurality of chips C (3 to 16 chips) located at the center of the wafer W and its peripheral portion by using the LIA system. The reliability degrees (Hxn,Hyn) of the calculated array coordinate values are also detected. The wafer stage WS is stepped in accordance with the designed chip array coordinate values (array map), and the wafer mark WMy of the chip C whose array coordinate values are to be measured is positioned within the range of P/4 with respect to the beams LB1s and LB2s.

The beams LB1s and LB2s are radiated on the wafer mark WMy, and the photoelectric detector 11y (light-receiving surface 40) receives the interference beam BTL generated from the wafer mark WMy. The ASC 19 detects a phase difference ($\pm 180°$) between the optical beat signals SDw and SR on the basis of the optical beat signal SDw from the photoelectric detector 11y and the optical beat signal (reference signal) Sr from the photoelectric detector 15d. The position of the wafer mark WMy in the Y direction is calculated from the phase difference falling within the range of P/2.

The above operation is repeated to measure Y-direction positions of the remaining chips C (wafer mark WMy) and the X-direction position of the wafer mark WMx. These measured values are stored as chip array coordinate values (Fxn,Fyn), thus completing sample alignment. In this case, the main controller MCS also stores the intensities, i.e., the amplitudes (Gxn,Gyn) of the optical beat signals SDw output from the photoelectric detectors 11x and 11y in units of chips (step 103).

The main controller MCS determines in step 104 the reliability degrees (Hxn,Hyn) of the array coordinate values (Fxn,Fyn) on the basis of the measurement results of step 103, i.e., the amplitudes (Gxn,Gyn) of the optical beat signals SDw. The reliability degree (Hxn,Hyn) is 1 for a chip C (wafer marks WMx and WMy) having the maximum amplitude (Gxn,Gyn). A chip C having an amplitude smaller than the constant G0 in equation (2) is given a reliability of 0. A chip C having an intermediate amplitude has a reliability degree falling within the range of 0<(Hxn,Hyn)<1. When the amplitude is increased, the reliability degree (Hxn,Hyn) comes close to 1.

The main controller MCS determines regularity of the chip array on the wafer W subjected to positioning in accordance with the step-and-repeat scheme, i.e., the transform parameters (A,O) represented in the mapping relation (Fn=A·Dn+O) by equation (3) on the basis of the array coordinate values (Fxn,Fyn) and the reliability degrees (Hxn,Hyn) of the chips C detected in steps 103 and 104, and the design array coordinate values (Dxn,Dyn) prestored in the memory.

In this case, the remaining rotational amount $\theta$, the scaling amount $\omega$, the linear elongation/contraction amounts (Rx,Ry), and the offset amounts (Ox,Oy) are present between the X-Y coordinate systems of the wafer stage WS and the $\alpha$-$\beta$ coordinate system of the chips. The transform parameters (A,O) are determined by a linear transform function (matrix) representing these parameters, so that the measured array coordinate values (Fxn,Fyn) are caused to correspond to the designed array coordinate values (Dxn,Dyn):

Remaining rotational amount: $\begin{bmatrix} \cos\theta & -\sin\theta \\ \sin\theta & \sin\theta \end{bmatrix}$ Scaling amount: $\begin{bmatrix} 1 & -\tan\omega \\ 0 & 1 \end{bmatrix}$ Linear elongation/contraction amounts: $\begin{bmatrix} Rx & 0 \\ 0 & Ry \end{bmatrix}$ Offset amounts: $\begin{bmatrix} Ox \\ Oy \end{bmatrix}$ The transform parameters (A,O) are represented as follows:

$$A = \begin{bmatrix} a_{11} & a_{12} \\ a_{21} & a_{22} \end{bmatrix} \tag{4}$$

$$= \begin{bmatrix} \cos\theta & -\sin\theta \\ \sin\theta & \cos\theta \end{bmatrix} \begin{bmatrix} 1 & -\tan\omega \\ 0 & 1 \end{bmatrix} \begin{bmatrix} Rx & 0 \\ 0 & Ry \end{bmatrix}$$

$$= \begin{bmatrix} Rx\cdot\cos\theta & -Ry(\cos\theta\cdot\tan\omega + \sin\theta) \\ Ry\cdot\sin\theta & Ry(-\sin\theta\cdot\tan\omega + \cos\theta) \end{bmatrix}$$

$$O = \begin{bmatrix} b_{11} \\ b_{21} \end{bmatrix} = \begin{bmatrix} Ox \\ Oy \end{bmatrix} \tag{5}$$

The chip C on the wafer W has a remaining term ($\epsilon Xn, \epsilon Yn$) as differences between the actual array coordinate values (Fxn,Fyn) and the design array coordinate values (Dxn,Dyn). Equation (3) can be rewritten as equation (6) below:

$$\begin{bmatrix} Fxn \\ Fyn \end{bmatrix} = A \begin{bmatrix} Dxn \\ Dyn \end{bmatrix} + O + \begin{bmatrix} \epsilon Xn \\ \epsilon Yn \end{bmatrix} \tag{6}$$

The transform parameters A and O are determined by, e.g., the method of least squares so that square sums $\Sigma\epsilon Xn^2$ and $\Sigma\epsilon Yn^2$ of the remaining differences become minimum.

When the reliability degree (Hxn,Hyn) is not taken into consideration at all, the square sum E of the remaining differences is defined as indicated by equation (7):

$$E = \sum_{n=1}^{m} \epsilon Xn^2 + \sum_{n=1}^{m} \epsilon Yn^2 \tag{7}$$

where n is the number of chips subjected to sample alignment ($m \geq 3$).

In this embodiment, however, the square sum E of the remaining difference is defined by equation (8) using the reliability degree (Hxn,Hyn) of the array coordinate values (Fxn,Fyn) of the chip:

$$E \sum_{n=1}^{m} (Hxn \cdot \epsilon Xn)^2 + \sum_{n=1}^{m} (Hyn \cdot \epsilon Yn)^2 \tag{8}$$

As is apparent from equation (8), when two terms on the right-hand side of equation (8) are substituted by Ex and Ey, respectively, the square sum E becomes minimum when the values Ex and Ey become minimum. The terms Ex and Ey can be written as follows:

$$Ex = \sum_{n=1}^{m} Hxn^2(Fxn - (a_{11}Dxn + a_{12}Dyn + Ox))^2 \quad (9)$$

$$Ey = \sum_{n=1}^{m} Hyn^2(Fyn - (a_{21}Dxn + a_{22}Dyn + Oy))^2 \quad (10)$$

In order to obtain $a_{11}$, $a_{12}$, $a_{21}$, $a_{22}$, $b_{11}(Ox)$, and $b_{21}(Oy)$ which minimize the values of both equations (9) and (10), equations (9) and (10) are partially differentiated using the unknown values $a_{11}$, $a_{12}$, and Ox, and the unknown values $a_{21}$, $a_{22}$, and Oy. These partial differential equations are assumed to be zero, and these simultaneous equations are solved. The results are written in the matrix form, as indicated by equations (11) and (12) below:

$$\begin{bmatrix} a_{11} \\ a_{12} \\ b_{11} \end{bmatrix} = B^{-1} \begin{bmatrix} \sum_{n=1}^{m} Hxn^2 \cdot Fxn \\ \Sigma Hxn^2 \cdot Fxn \cdot Dxn \\ \Sigma Hxn^2 \cdot Fxn \cdot Dyn \end{bmatrix} \quad (11)$$

$$\begin{bmatrix} a_{21} \\ a_{22} \\ b_{21} \end{bmatrix} = C^{-1} \begin{bmatrix} \sum_{n=1}^{m} Hyn^2 \cdot Fyn \\ \Sigma Hyn^2 \cdot Fyn \cdot Dxn \\ \Sigma Hyn^2 \cdot Fyn \cdot Dyn \end{bmatrix} \quad (12)$$

For $$B = \begin{bmatrix} \sum_{n=1}^{m} Hxn^2 \cdot Dxn & \Sigma Hxn^2 \cdot Dyn & \Sigma Hxn^2 \\ \Sigma Hxn^2 \cdot Dxn^2 & \Sigma Hxn^2 \cdot Dxn \cdot Dyn & \Sigma Hxn^2 \cdot Dxn \\ \Sigma Hxn^2 \cdot Dxn \cdot Dyn & \Sigma Hxn^2 \cdot Dyn^2 & \Sigma Hxn^2 \cdot Dyn \end{bmatrix}$$

$$C = \begin{bmatrix} \sum_{n=1}^{m} Hyn^2 \cdot Dxn & \Sigma Hyn^2 \cdot Dyn & \Sigma Hyn^2 \\ \Sigma Hyn^2 \cdot Dxn^2 & \Sigma Hyn^2 \cdot Dxn \cdot Dyn & \Sigma Hyn^2 \cdot Dxn \\ \Sigma Hyn^2 \cdot Dxn \cdot Dyn & \Sigma Hyn^2 \cdot Dyn^2 & \Sigma Hyn^2 \cdot Dyn \end{bmatrix}$$

When the array coordinate values (Fxn,Fyn) of the chips C upon completion of sample alignment and their reliability degrees (Hxn,Hyn) are sequentially added in equations (11) and (12), the unknown values $a_{11}$, $a_{12}$, $a_{21}$, $a_{22}$, $b_{11}$, and $b_{21}$ can be obtained. When the unknown values $a_{11}$, $a_{12}$, $a_{21}$, $a_{22}$, $b_{11}$, and $b_{21}$ are obtained, the six parameters, i.e., the remaining rotational amount $\theta$, the scaling amount $\omega$, the linear elongation/contraction amounts (Rx,Ry), and the offset values (Ox,Oy) are obtained on the basis of the following relations:

$\theta = a_{21}/a_{22}$ $\omega = -(a_{12}/a_{11}) - (a_{21}/a_{22})$ $Rx = a_{11}$ $Ry = a_{22}$ $Ox = b_{11}$ $Oy = b_{21}$ As described above, the transform parameters (A,O) are determined, and the correspondence between actual and design coordinate values of the chip array on the wafer W can be derived from equation (3) (step 105).

The main controller MSC steps the wafer stage WS and superposes the projected image of the reticle pattern with the chips C, thereby performing exposure in accordance with the transform parameters calculated in step 105 (step 106). When superposing and exposure of all the chips C are completed, the wafer W is unloaded from the stepper (step 107).

The operations in steps 100 to 107 ar repeated in units of wafers, and high-speed, high-precision superposing and exposure can be performed without decreasing the throughput and degrading alignment measurement precision, which drawbacks are caused by chips having poor reliability for alignment measurement purposes.

In this embodiment, the reliability degree (Hxn,Hyn) of the array coordinate values is determined by equation (2). In this case, the reliability degree (Hxn,Hyn) may locally vary on a single wafer. That is, the reliability degrees of the chips on the upper half of the wafer may be extremely different from those of the lower half thereof. If this happens, the array coordinate values of one half (e.g., the upper half) having a higher reliability degree are mainly reflected in the determination of the transform parameters (A,O). When the reticle pattern is superposed on the chips C to expose the image of the reticle pattern on the basis of the transform parameters (A,O) obtained as described above, superposing and exposure of the other half (e.g., the lower half) would be degraded.

In order to prevent the above drawback, the wafer W is divided into several blocks (I to IV in FIG. 9), and the reliability degrees (Hxn,Hyn) are calculated by using equation (2) in units of blocks. In this case, of all the optical beat signals SDw from chips, (wafer marks WMx and WMy) subjected to sample alignment in units of blocks, an optical beat signal having a maximum amplitude Gn is selected, and the maximum amplitude Gmax is applied to equation (2). Local irregularity of the distribution of the reliability degrees within the wafer W can be eliminated (i.e., averaged). Therefore, degradation of the calculation precision (superposing precision) of the transform parameters (A,O) can be prevented.

Figure 9:
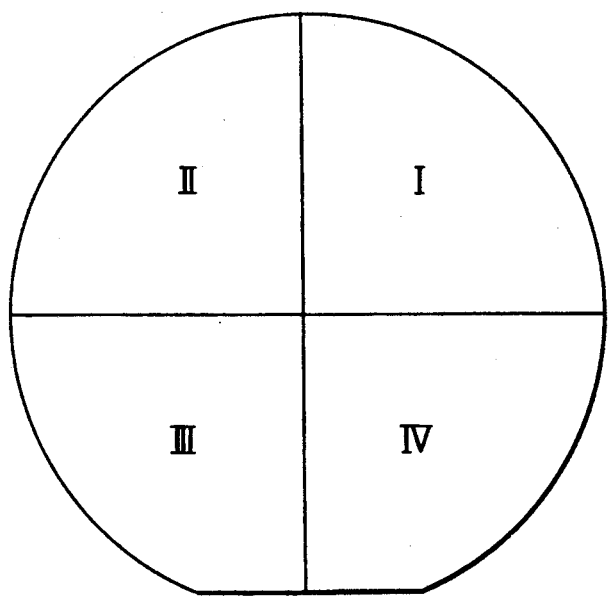
FIG. 9 is a view for explaining a modification of the present invention.

In the case of FIG. 9, the wafer W is divided into the four blocks I to IV. The number of blocks need not be limited to four and need not be limited to a specific number. The shape of the block need not be limited to a sector shape as shown in FIG. 9, but can be arbitrarily determined to be, e.g., a concentric shape. Alternatively, a division method (e.g., the number of blocks, and the block shapes) may be changed by the wafer marks WMx and WMy formed on the wafer to determine the blocks.

In the above embodiment, the reliability degree (Hxn,Hyn) is calculated by equation (2) on the basis of the amplitudes (Gxn,Gyn) of the optical beat signals SDw from the photoelectric detectors 11x and 11y. However, the relation for the amplitude Gn and the reliability degree Hn is not limited to equation (2). For example, any one of equations (13) to (15) may be used.

$$Hn = MIN[MAX\{(Gn - g_0)/(Ga - g_0), 0\}, 1] \tag{13}$$

where Ga and $g_0$ are constants which can be empirically determined as is the constant $G_0$ in equation (2), $g_0 = Gmin = MIN(G_1, G_2, \ldots, Gm)$ (where m is the number of chips subjected to sample alignment), or $g_0 = G_{ave} - K \cdot \sigma(Gn)$ (where $K > 0$, and $\sigma(Gn)$ is a variance). As for the constant Ga, $Ga = Gamx = MAX(G1, G2, \ldots, Gm)$ or $Ga = G_{ave} + K \cdot \sigma(Gn)$ ($K > 0$) may be given.

$$Hn = [MIN[MAX\{(Gn - g_0)/(Ga - G_0), 0\}, 1]] \tag{14}$$

where the constants Ga and $g_0$ are defined as in equation (13), and $\tau$ is a real number satisfying condition $\tau > 0$.

$$Hn = EXP[-\{(Gn - G_{ave})/S\}^2] \tag{15}$$

where S is a constant which can be determined empirically or in accordance with relation $S = K \cdot \sigma(Gn)$ ($K > 0$).

Equations (13) and (14) are obtained by generalizing equation (2) and are based on the same concept as equation (2). The reliability degree becomes 1 for $Gn = G_{ave}$ in equation (15). When the amplitude Gn is larger than $G_{ave}$, equation (15) is different from equations (13) and (14) if $Hn < 1$. When a larger amplitude Gn than those of other chips is obtained, occurrence of an abnormality can be determined according to the concept of equation (15).

The above embodiment exemplifies a case wherein the LIA system (especially a heterodyne scheme) is used as an alignment sensor. However, a homodyne LIA system, a homodyne LSA system, a homodyne FIA system, or a heterodyne alignment sensor of a through-the-recticle (TTR) scheme disclosed in Japanese Laid-Open Patent Application No. 63-283129 (corresponding to U.S. Ser. No. 192,784 filed on May 10, 1988) may be used to obtain the same effect as in the above embodiment. An operation of measuring the reliability degrees using an LSA system and an FIA system will be briefly described below.

Figure 10A:
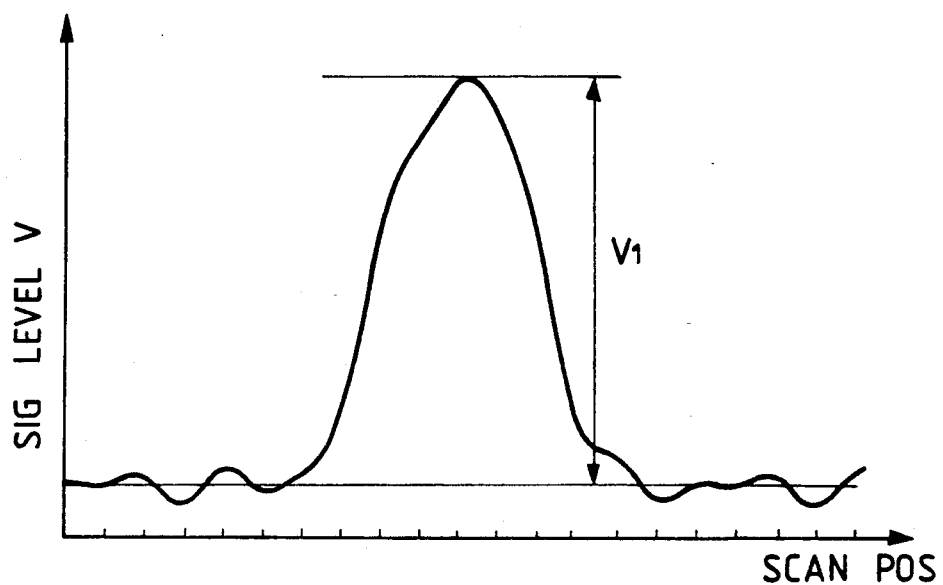
FIGS. 10A and 10B and FIGS. 11A and 11B are views for explaining a method of the present invention using an LSA system.
Figure 10B:
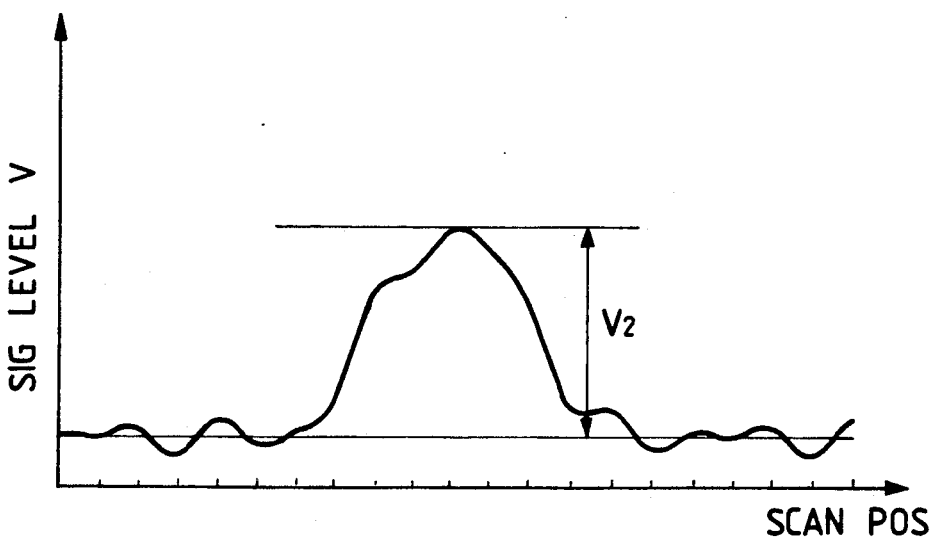

FIGS. 10A and 10B are waveform charts of output signals (photoelectric signals SDi) from photoelectric detectors (i.e., light-receiving surfaces 41a and 41b) which receive diffracted beams 44 from the mark upon relative scanning of an LSA spot beam SP on a wafer mark (LSA mark). In a normal state, this photoelectric signal has a waveform shown in FIG. 10A. Even if the LSA system is used, a diffracted beam (noise component) is generated by speckles due to grains of a metal layer as in the LIA system. For this reason, this noise component is received by the photoelectric detector together with the diffracted beam from the mark. The photoelectric signal (FIG. 10B) containing this noise component has a lower signal intensity than that of the signal shown in FIG. 10A. For example, a peak value V2 is decreased.

When the intensities (peak values V1 and V2) of the photoelectric signals SDi are used in place of the amplitudes (Gxn,Gyn) of the optical beat signals SDw in equations (2) and (13), the reliability degrees (Hxn,Hyn) can be calculated in the EGA measurement using the LSA system. Therefore, degradation of the EGA measurement precision caused by chips having poor reliability for purpose of such measurement can be prevented.

Figure 11A:
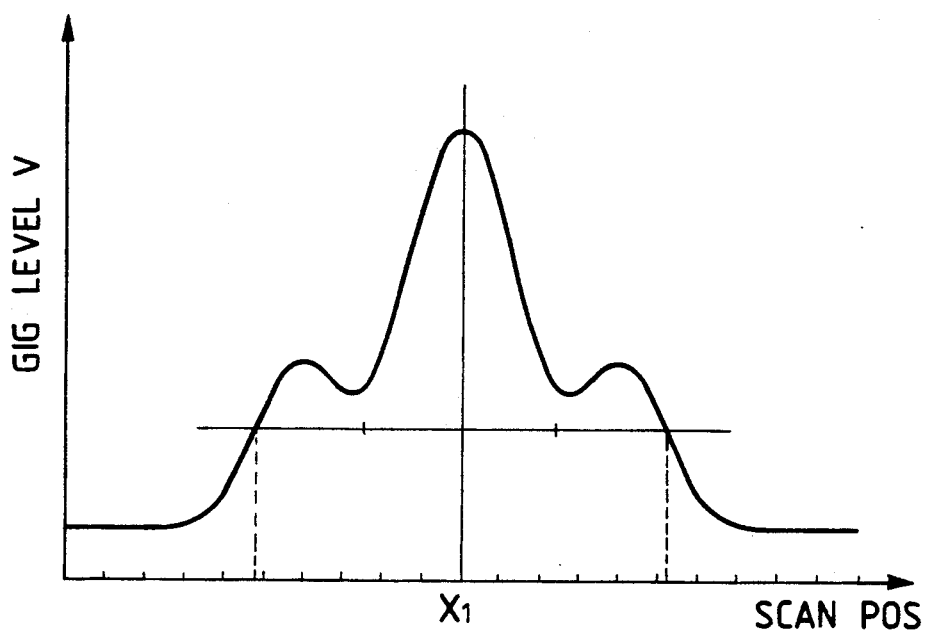
Figure 11B:
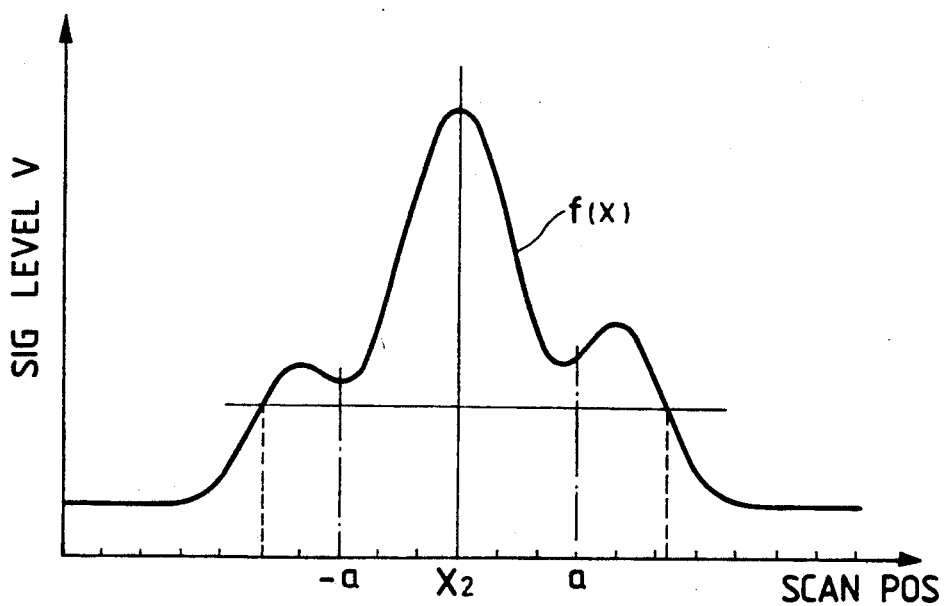

It is also possible to calculate reliability degrees (Hxn,Hyn) from the symmetrical relationship of the waveform of the photoelectric signal SDi in the LSA system. FIGS. 11A and 11B show waveforms of photoelectric signals SDi output from photoelectric detectors 11x and 11y. In a normal state, the photoelectric signal SDi has a waveform symmetrical about a scanning position X1 at which the signal magnitude has a peak, as shown in FIG. 11A. However, due to mark damage and a non-uniform thickness of a resist layer in the wafer process (e.g., etching), the photoelectric signal has a waveform asymmetrical about a peak position X2, as shown in FIG. 11B.

For example, if a relation representing the waveform of the photoelectric signal SDi in FIG. 11B is given as $V = f(x)$, a value u0 for minimizing I(u) in equation (16) below is obtained. Since the $I(u_0)$ value becomes zero in a perfectly symmetrical state of the waveform, the symmetry of the waveform can be detected by judging the magnitude of the $I(u_0)$ value:

$$I(u) = \int_{-a}^{a} \{f(u + v) - f(u - v)\}^2 dv \tag{16}$$

where a and -a are arbitrary constants representing a scanning range (distance).

When a reliability degree is to be calculated from the $I(u_0)$ value, a relation which increases the reliability degree (close to 1) when the $I(u_0)$ value is close to 0 must be used unlike the amplitude Gn in the above embodiment. Equations (2) and (13) cannot be directly used in this case.

For example, if transform relation $I' = 1/\sqrt{I(u_0)}$ is used and is used in place of the amplitude Gn in equations (2), (13), and (14), the reliability degree can be calculated in accordance with symmetry detection of the photoelectric signal SDi, thereby preventing degradation of EGA measurement precision caused by chips having poor reliability for purposes of such measurement. Note that if condition $I(u_0) = 0$ is established in the above transform relation, the $I(u_0)$ value must be substituted with an appropriate value so as to prevent overflow of the main controller MCS (computer, not shown).

Equation (15) is not used to calculate a reliability degree using the symmetry (equation (16)) of the signal waveform. In this embodiment, when the amplitude Gn in the LIA system is increased, the reliability degree is not necessarily high. However, it is assumed that the reliability degree can be the highest by an almost symmetrical waveform when waveform symmetry is used in the LSA system.

When EGA measurement is to be performed using the LSA system, the magnitudes (peak values) of the photoelectric signals SDi from the photoelectric detectors 11x and 11y, or the waveform symmetry (equation (16)) is used to calculate the reliability degrees, thereby preventing degradation of the EGA measurement precision. For a wafer W which is almost free from a non-uniform thickness of a resist film and surface roughness caused by sputtering of a metal layer, switching from the LSA system to the LIA system may not be performed, and EGA measurement may be performed using the LSA system.

Figure 12A:
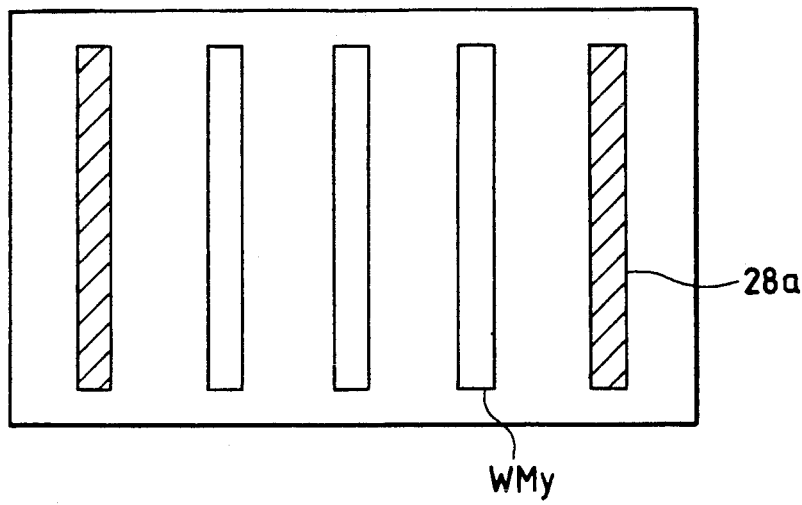
FIGS. 12A and 12B are views for explaining a method of the present invention using an FIA system.
Figure 12B:
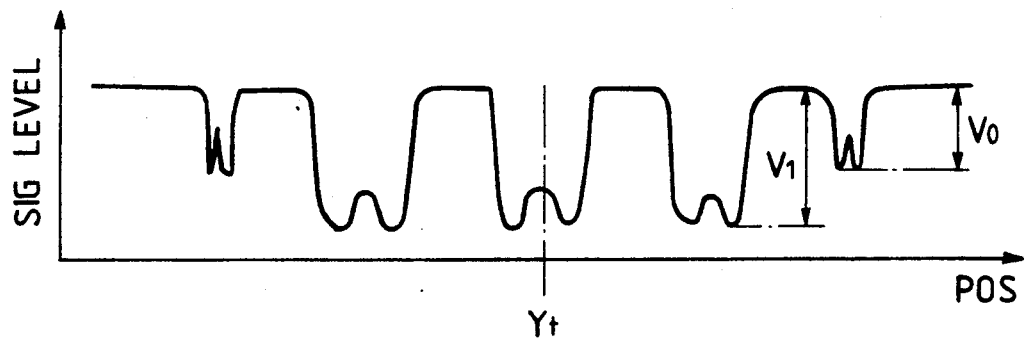

FIG. 12A shows the index mark 28a observed by the image pickup device 32 in the FIA system and the wafer mark WMy. An image signal output form the image pickup device 32 has a waveform, as shown in FIG. 12B. In the FIA system, since the image signal is AGC- (automatic gain control) controlled, the absolute values of the signal magnitudes (i.e., intensities of beam: returning from the mark) in units of chips (wafer mark) cannot be obtained, and the signal magnitudes cannot be directly compared with each other. In view of this, for example, signal magnitudes $V_0$ and $V_1$ of the index mark 28a and the wafer mark WMy are obtained. A ratio $V_1/V_0$ is used in place of the amplitude Gn of this embodiment in the equations (2) and (13). Then, the reliability degrees of the array coordinate values of the chips C can be calculated as in the LIA system.

If amplification factors (gains) of the chips are stored, the absolute values of the signal amplitudes in units of wafer marks can be applied to equations (2) and (13) to calculate the reliability degrees without calculating the magnitude ratio V1/V0.

When reliability degrees are to be calculated from symmetry of a signal waveform in the FIA system, a position Yt corresponding to a peak of an image signal may be selected, as shown in FIG. 12B, and a reliability degree may be calculated in accordance with symmetry of a waveform at the position Yt in the same operation as in the LSA system.

Figure 13:
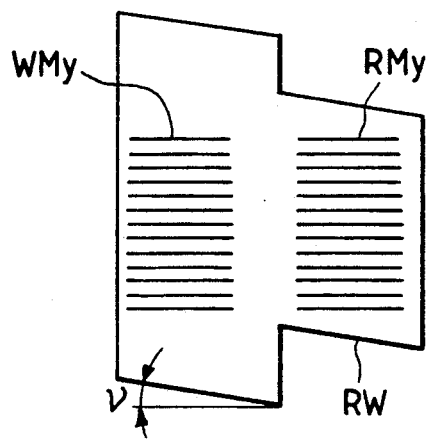
FIG. 13 is a schematic view showing a reticle mark pattern suitable in a TTR heterodyne type alignment sensor.

When a TTR heterodyne alignment sensor is used, a reticle mark RMy shown in FIG. 13 may be formed within a transparent window RW. In the same manner as in the viewing aperture 17 (rhombic opening) shown in the above embodiment, upon radiation of two parallel beams, degradation of alignment measurement precision which is caused by mixing of a diffracted beam (Fraunhofer diffraction) generated from an edge parallel to a grating of the mark RMy of the window RW can be prevented. The reticle mark RMy consists of a reticle diffraction grating mark and a light-transmitting portion through which two parallel beams cross each other and pass through to radiate the wafer mark WMy. At the same time, the diffraction grating mark and an edge extending in a direction almost perpendicular to a direction of pitch of an interference fringe pattern formed by the two parallel beams are inclined by an angle $v$ with respect to a direction almost perpendicular to the direction of pitch.

In the above embodiment, the method of the present invention is applied to an exposure apparatus. The present invention is also applicable to an apparatus for sequentially testing wafers in accordance with a step-and-repeat scheme, an apparatus for radiating a laser beam on some of elements on a wafer to repair the irradiated elements, and the like, thereby obtaining the same effect as in the above embodiment.

According to the present invention, in order to determine regularity of a pattern array on a substrate, since reliability degrees of pattern position information (array coordinate values) are used, degradation of alignment measurement precision which is caused by array coordinate values having poor reliability (indefinite reliability) can be prevented. The array coordinate values of the pattern subjected to positional measurement (sample alignment) are not wasted. As a result, it is possible to determine regularity of a pattern array with a highest reliability degree by using position information of all the patterns upon completion of the sample alignment.

What is claimed is:

1. A method of determining regularity of a pattern array on a substrate and of positioning patterns of the array relative to a reference position, comprising:

the step of calculating a reliability degree for a measured value of a pattern position;

the step of determining the regularity of the pattern array on the basis of the calculated reliability degree and a design value and the measured value of the pattern position; and the step of sequentially positioning said patterns of the array relative to said reference position on the basis of the determined regularity.

2. A method according to claim 1, wherein the measured value of the pattern position is detected as a position of an associated alignment mark with respect to the reference position, and the reliability degree of the measured value is calculated on the basis of optical information generated by the alignment mark when a position of the alignment mark is optically detected.

* * * * *